United States Patent
Downes, Jr. et al.

(10) Patent No.: US 6,176,985 B1
(45) Date of Patent: Jan. 23, 2001

(54) LAMINATED ELECTROPLATING RACK AND CONNECTION SYSTEM FOR OPTIMIZED PLATING

(75) Inventors: Francis J. Downes, Jr.; Raymond Thomas Galasco; Robert Maynard Japp, all of Vestal; John Frank Surowka, Binghamton, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/178,084

(22) Filed: Oct. 23, 1998

(51) Int. Cl.$^7$ .................................................. C25D 17/04
(52) U.S. Cl. ......................................................... 204/297.1
(58) Field of Search ........................... 204/297 W, 297.1, 204/288.1

(56) References Cited

U.S. PATENT DOCUMENTS

| | | | |
|---|---|---|---|
| 3,968,022 | * | 7/1976 | Eng et al. ........................... 204/288.1 |
| 3,970,539 | * | 7/1976 | Collins et al. ........................ 204/254 |
| 4,051,088 | * | 9/1977 | Ford et al. ......................... 204/288.1 |
| 4,100,054 | * | 7/1978 | DuRocher ......................... 204/297 W |
| 4,484,996 | | 11/1984 | Bongartz et al. ..................... 204/206 |
| 4,606,891 | * | 8/1986 | Murphy, Jr. et al. ................... 422/53 |
| 4,687,562 | | 8/1987 | Smith et al. .......................... 204/206 |
| 4,714,534 | * | 12/1987 | Fair et al. ............................ 204/269 |
| 4,714,535 | | 12/1987 | Coombes, Jr. et al. .............. 204/297 |
| 4,818,349 | | 4/1989 | Smith ..................................... 204/15 |
| 4,885,071 | | 12/1989 | Murakami ............................. 204/206 |
| 5,017,275 | | 5/1991 | Niksa et al. .......................... 204/206 |
| 5,019,944 | | 5/1991 | Ishii et al. ............................. 361/400 |
| 5,118,299 | | 6/1992 | Burns et al. ........................... 439/74 |
| 5,172,473 | | 12/1992 | Burns et al. ........................... 29/885 |
| 5,185,073 | | 2/1993 | Bindra et al. ......................... 205/104 |
| 5,190,463 | | 3/1993 | Datta et al. ............................ 439/74 |
| 5,298,685 | | 3/1994 | Bindra et al. ......................... 174/250 |
| 5,389,220 | | 2/1995 | Herzog et al. ....................... 204/206 |
| 5,435,057 | | 7/1995 | Bindra et al. ......................... 29/830 |
| 5,456,814 | * | 10/1995 | Metzka ............................. 204/297 R |
| 5,764,071 | | 6/1998 | Chan et al. ........................... 324/754 |

OTHER PUBLICATIONS

Graves, J.E. and Bach, W. "Conveyerized horizontal electroplate system for printed circuit boards," Proc. IPC Conf. San Jose, CA, Mar. 1997, Abstract.

* cited by examiner

*Primary Examiner*—Kathryn Gorgos
*Assistant Examiner*—Erica Smith-Hicks
(74) *Attorney, Agent, or Firm*—John R. Pivnichny

(57) ABSTRACT

An electroplating apparatus provides high current electrical connections in a small area to a workpiece. The contact area may use a dendrite surface to improve the connection. An insulative gasket prevents electroplating fluids from entering the region about the contact area. A heavy core laminated within a supporting structure provides uniform current distribution of high electrical currents to the dendrite covered contact areas.

16 Claims, 4 Drawing Sheets

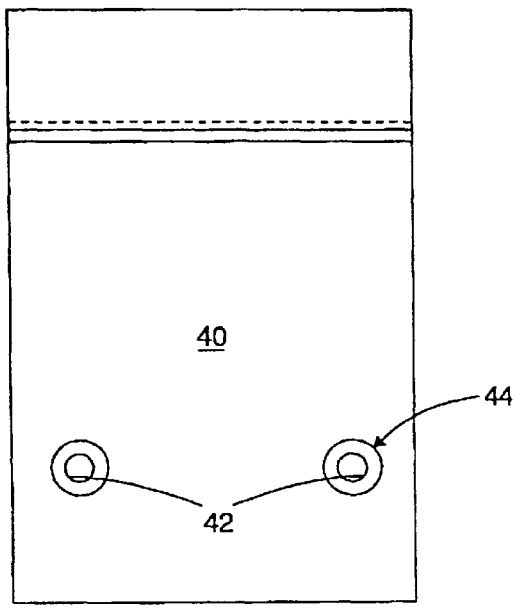
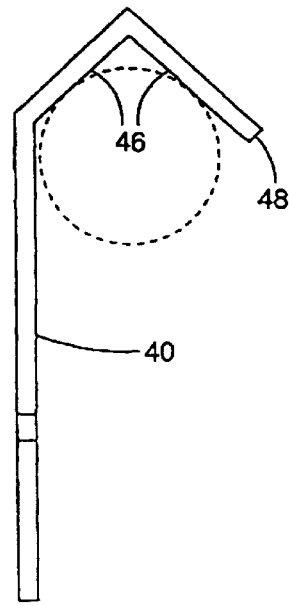
FIG. 3　　　　　　　　FIG. 4
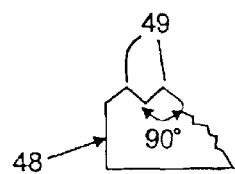
FIG. 5

LAMINATED ELECTROPLATING RACK AND CONNECTION SYSTEM FOR OPTIMIZED PLATING

TECHNICAL FIELD

The invention relates to electroplating apparatus and in particular to apparatus for making high current connections to a workpiece which are sealed from contact with the electroplating solution.

BACKGROUND OF THE INVENTION

Electroplating is widely practiced in the printed circuit industry to add layers of various metals to other conductors. Copper may be plated to increase the thickness of conductors. Layers of nickel and gold are routinely added to copper for protection to prevent oxidation. A great variety of materials, thicknesses and layers are known in the electroplating art.

Dendrite surfaces are also applied using electroplating techniques with emphasis on pulsed high currents. Such dendrite surfaces, also referred to as "nodules" or "cones", have many uses in the circuit board industry which by way of example are shown in U.S. Pat. Nos. 5,435,057, 5,298,685, 5,185,073, 5,190,463, 5,118,299, 5,019,944 and 5,764,071. A method of making dendrites is described in U.S. Pat. No. 5,172,473 which is incorporated herein by reference.

Workpieces to be plated may be placed on an electroplating rack which is constructed to mechanically hold and provide electrical connection(s) to the workpiece(s). For example, Coombes et al describes a molded rack in U.S. Pat. No. 4,714,535. Conventional plating racks apply pressure, generally in the form of a spring force or a gripping force at the point(s) of electrical connection. This point(s) is generally at a location on the workpiece which is not visible when the workpiece is used as a final product.

In order to have a uniform plating thickness over a relatively large area when high plating currents are involved, establishing a good electrical contact with workpieces is necessary. Making good contact, however, has been a problem in a high volume manufacturing situations because the contact must be made and removed quickly as the workpiece is transferred from tank to tank of various electroplating and rinsing solutions. Furthermore, the contact is subject to exposure to electroplating fluids many of which are acidic or alkaline. For example, nickel is usually plated at a Ph of 3.5–4, gold at 5.5 to 7, and palladium at 8–9. Usually the contact will need to be immersed in the plating bath along with the workpiece during electroplating. Continuously moving contacts such as a moving belt as described by Smith et al in U.S. Pat. No. 4,818,349 or other continuous contact arrangements in U.S. Pat. Nos. 4,885,071, 5,017,275 and 5,389,220 cannot provide the necessary high current capability in a small area of the workpiece. Such exposure to fluids may degrade the contact either during plating or prevent its re-use on subsequent workpieces.

OBJECTS AND SUMMARY OF THE INVENTION

It is therefore a principal object of the present invention to enhance the electroplating art by providing a plating rack with enhanced, reusable, high current contacting capability.

It is another object to provide a high current contacting capability over a small contact area.

It is a further object to provide an enhanced contacting capability usable at a plurality of contact spots on a workpiece.

It is yet another object of the invention to provide a method of electroplating a workpiece which can be accomplished in an improved and facile manner.

These and other objects are attained in accordance with one embodiment of the invention wherein there is provided an electroplating rack for holding a workpiece during plating, comprising a supporting structure having an electrically insulative surface positioned about an electrically conductive core with at least two openings in said insulative surface exposing at least two areas of said electrically conductive core, a plating current source contact attached to a first of the two areas of the electrically conductive core, a second contact for providing an electrical connection to a workpiece, the second contact attached to and making electrical connection to a second of the two areas of the electrically conductive core, and an electrically insulative gasket positioned about the second contact to prevent electroplating fluid from contacting the second contact when the second contact provides the electrical connection to the workpiece.

In another embodiment of the invention there is provided a connection for use in electroplating a workpiece, comprising an electrically conductive core member of elongated construction, an electrically insulative member substantially about the electrically conductive core member, the electrically insulative member including at least two openings therein for exposing respective open areas of the electrically conductive core, the first exposed area adapted for connecting to a power source and the second exposed area adapted for being electrically connected to a workpiece, and an electrically insulative member adjacent the workpiece for substantially preventing a solution from contacting the core member in the region of the second area.

In yet another embodiment there is provided a method of electroplating a workpiece, comprising the steps of providing a supporting structure having an electrically insulative surface positioned about an electrically conductive core with at least two openings in the insulative surface exposing at least two areas of the electrically conductive core, attaching a plating source contact to a first area of the electrically conductive core, attaching a second contact for making an electrical connection to a workpiece, to a second area of the electrically conductive core, the second contact making electrical connection to the electrically conductive core, positioning an electrically insulative gasket about the second contact, and bringing the workpiece into electrical connection with the second contact so that the gasket prevents electroplating fluid from contacting the second contact when the second contact provides the electrical connection to the workpiece.

BRIEF DESCRIPTION OF THE DRAWINGS

FIG. 3 shows a front view of a structure providing a contact to a high current electrical source;

FIG. 4 shows a side view of the structure of FIG. 3; and

FIG. 5 shows multiple knife edges which may be used on part of the structure of FIG. 3.

BEST MODE FOR CARRYING OUT THE INVENTION

For a better understanding of the present invention, together with other and further objects, advantages and capabilities thereof, reference is made to the following disclosure and the appended claims in connection with the above-described drawings.

Figure 1:
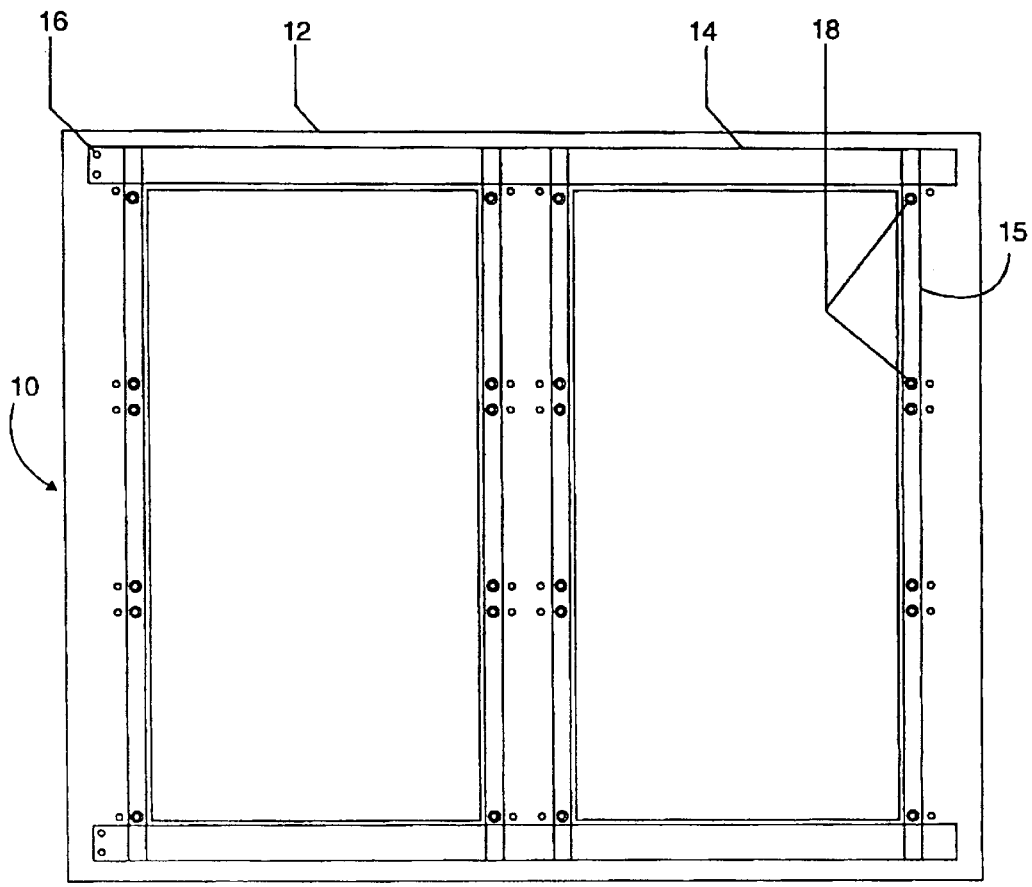
FIG. 1 illustrates a plating rack in accordance with the present invention.
Figure 2A:
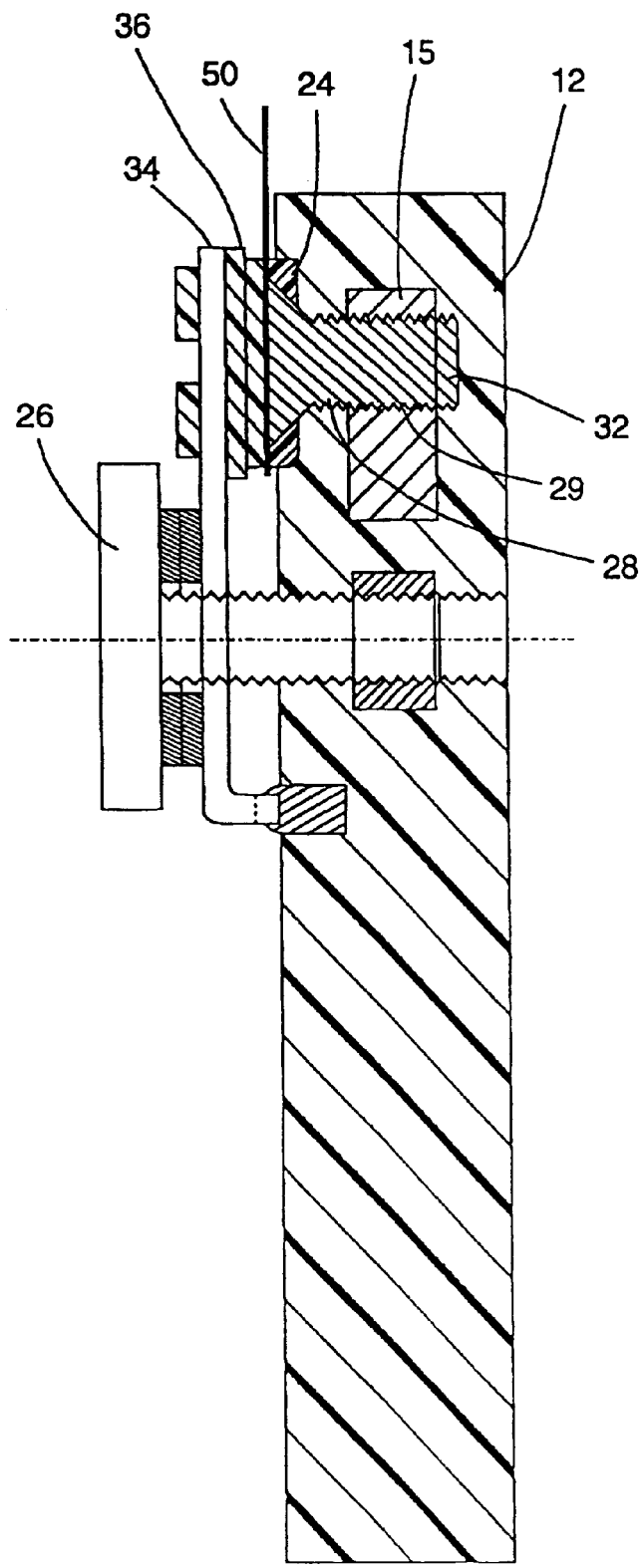
FIGS. 2A and 2B show a structure for contacting a workpiece in the assembled and opened or exploded views respectively.
Figure 2B:
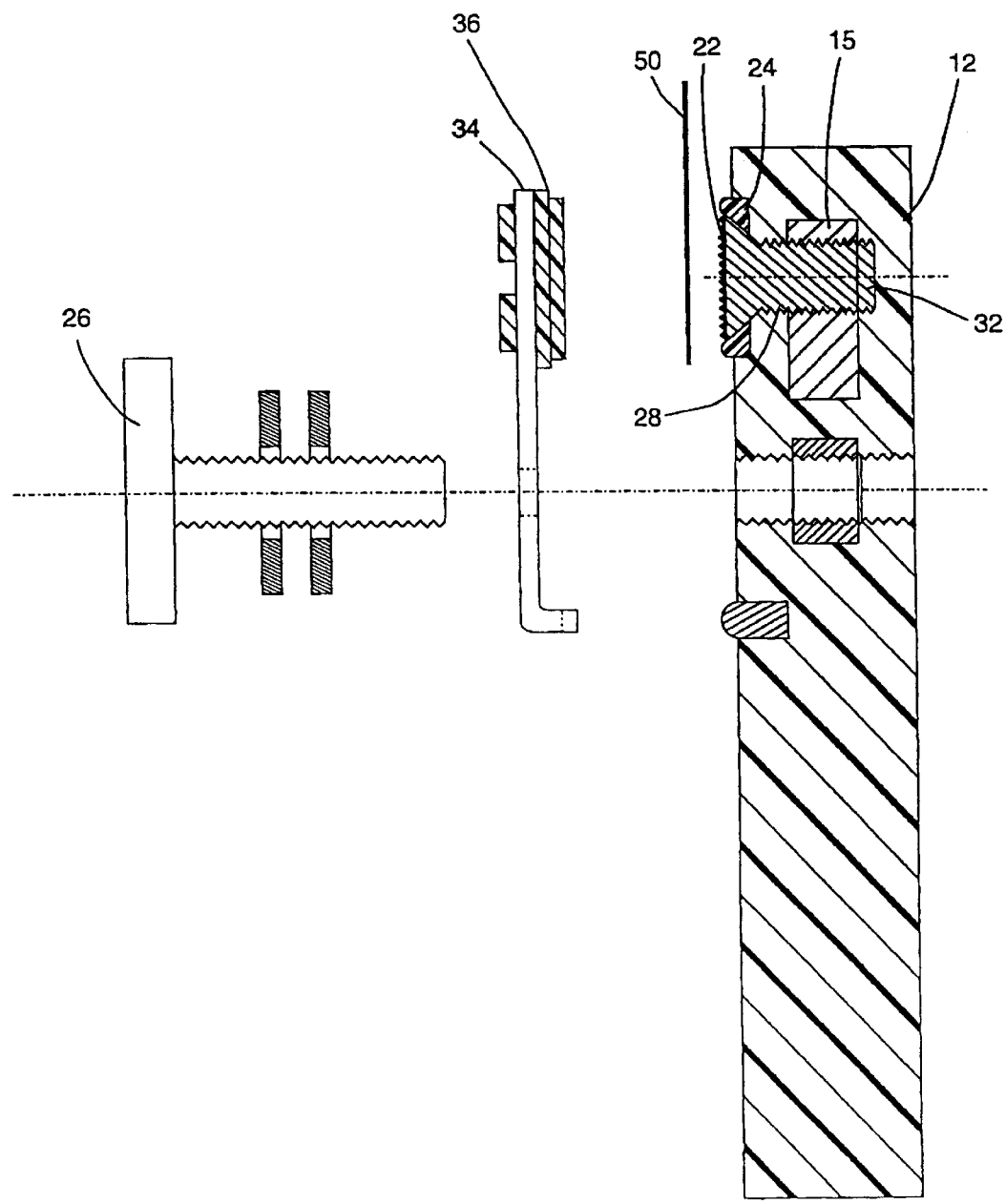

In FIG. 1 there is shown a supporting structure 10 having an electrically insulated surface 12 and an electrically conductive core 14 and 15. The electrically conductive core 14 and 15 may be any electrically conductive material but is preferably a metal material and preferably made of copper. The electrically insulative surface 12 may be any electrically insulative material but is preferably a material known in the printed circuit industry as epoxy-glass. Epoxy-glass is a material made by impregnating a woven fabric or non-woven layer of fiber glass cloth fibers with an epoxy resin material and curing or partially curing the impregnated composite. Laminating provides a smooth surface which is desirable for solution transport across the surface during plating. This material may then be laminated in layers including laminating around a copper or other electrically conductive material core. The supporting structure 10 has at least two openings, 16 and 18 which expose at least two areas of the electrically conductive core. A plating current source contact is attached to a first of the openings 16 as shown in FIG. 1. A second contact for providing an electrical connection to a workpiece is attached to a second opening for example 18. There may be a plurality of these contacts for making electrical connection to a work piece. The core 14, 15 is preferably of sufficient size to provide substantially resistance free conduction of high plating currents to allow plating uniformity when using a plurality of second openings 18. Shown in FIGS. 2A and 2B are a second contact structure. In FIG. 2A the structure is shown assembled to a work piece 50 and in FIG. 2B the structure is shown in an exploded view to make the individual components more visible. As shown in FIG. 2A the supporting structure 10 and core 15 with insulative surface 12 has an opening 28 exposing an area 29 of core 15. The second contact 32 for making electrical connection to the workpiece 50 is in electrical connection with core 15 through area 29.

Workpiece 50 may be a circuitized or uncircuitized substrate, a circuit board, or any other object on which one wishes to add or remove material by electroplating including adding dendrites.

Electrical contact 32 may have dendrites on its surface 22 for better electrical contact where it comes in contact with workpiece 50 as shown in FIG. 2B. Surface 22 is preferably round with a diameter between 6 and 10 mm. Dendrites and a method of forming dendrites are described in U.S. Pat. No. 5,172,473. The irregular conical shape of dendrites provides an improved electrical connection between second contact 32 and workpiece 50 by dramatically increasing the area of surface contact between the two members. A much higher current can be applied to a given area of workpiece 50 when second contact 32 has a dendrite surface than would otherwise be possible. Electrically insulative gasket 24 is positioned about contact 32 and provides a seal to prevent electroplating fluid from contacting second contact 32 when the contact 32 is making electrical connection to the work piece 50 various methods are possible for bringing the electrical contact 32 into electrical connection with workpiece 50. For example, various spring arrangements or a thumb screw arrangement 26 as shown in FIG. 2A can be used with a spring member 34 and a resilient material 36 to assist in holding workpiece 50 in contact with electrical contact 32. Insulative gasket 24 may be made of any electrically insulative material but is preferably an elastomer material such as VITON™ and is preferably in contact with workpiece 50 and contact 32 as shown in FIG. 2A. VITON is a trademark of E.I. du Pont de Nemours & Co., Inc. The insulative gasket may also be made inflatable as a way to bring it into contact with contact 32 and workpiece 50.

Shown in FIG. 3 is a plating current source contact 40 shown in front view. Current source contact 40 has two holes 42 which may be drilled through or countersunk 44 as shown in FIG. 3. Current source contact 40 is normally attached preferably by bolting through holes 42, to first opening 16 of supporting structure 10 of FIG. 1 other fastening arrangements which provide a solid electrical connection between first contact 40 and core 15 may be used.

Shown in FIG. 4 is a side view of the plating current source contact 40 shown in FIG. 3. Plating current source contact 40 is bent as shown in FIG. 4 and has end 48 positioned so that it can be placed over a round bar or other source of plating current. Plating current source contact 40 is preferably made of copper, brass, or other copper alloy material, but can be made of any electrically conductive material preferably a metal material.

Surfaces 46 of plating current source contact 40 shown in FIG. 4 are preferably serrated to have knife edges 49 as shown in FIG. 5. The knife edges 49 facilitate the electrical connection between current source contact 40 and a source of plating current. The side walls of knife edge contacts 49 are preferably arranged at a 90 degree angle as shown in FIG. 5, however, any acceptable angle may be used depending on the material of plating current source contact 40.

In operation there are preferably two plating source contacts 40 mounted at the upper left and upper right positions on supporting structure 10 of FIG. 1 arranged so that supporting structure 10 can be hung from a cylindrical bar as shown in the dotted position of FIG. 4. The cylindrical bar provides the source of electrical current.

Preferably a plurality of second contacts, two are shown in FIG. 1, are located at various positions on supporting structure 10 about the peripheral area of workpiece 50. As mentioned, second contact 32 may have dendrites on its upper surface where it comes in contact with workpiece 50. It is important to prevent electroplating fluid from coming in contact with dendrites because such contact would eventually cause plating material to be plated in the spaces between the dendrites. Electrically insulated gasket 24 provides the necessary seal and thereby prevents such plating action from occurring, allowing second contact 32 to be reused after plating workpiece 50, for the electroplating of additional workpieces. The seal provided by gasket 24 is therefore considered an improvement in the art of electroplating and in particular when combined with a dendrite covered surface of second contact 32.

While there has been shown and described what is at present considered the preferred embodiment of the invention, it will be obvious to those skilled in the art that various changes and modifications may be made therein without departing from the scope of the invention as defined by the appended claims.

What is claimed is:

1. An electroplating rack for holding a workpiece during plating, comprising:

a supporting structure having an electrically insulative surface positioned about an electrically conductive core with at least two openings in said insulative surface exposing at least two areas of said electrically conductive core;

a plating current source contact attached to a first of said at least two areas of said electrically conductive core;

a second contact for providing an electrical connection to a workpiece, said second contact attached to and making electrical connection to a second of said at least two areas of said electrically conductive core; and an electrically insulative gasket positioned about said second contact to prevent electroplating fluid from contacting said second contact when said second contact provides said electrical connection to said workpiece.

2. The electroplating rack of claim 1 wherein said electrically insulative surface is epoxy-glass.

3. The electroplating rack of claim 1 wherein said electrically conductive core is copper.

4. The electroplating rack of claim 1 wherein said plating current source contact comprises a multiple knife edge.

5. The electroplating rack of claim 4 wherein said multiple knife edge portion is at least partially covered with gold.

6. The electroplating rack of claim 1 wherein said second contact comprises an area of dendrites for providing electrical connection to a workpiece.

7. The electroplating rack of claim 6 wherein said dendrites are palladium.

8. The electroplating rack of claim 1 wherein said insulative gasket is an elastomer.

9. The electroplating rack of claim 1 wherein said insulative gasket is inflatible.

10. The electroplating rack of claim 1 further comprising a plurality of second contacts for providing a plurality of electrical connection to a workpiece, said plurality of second contacts attached to and making electrical connection to one or more of said at least two areas of said electrically conductive core.

11. A connection for use in electroplating a workpiece, comprising:

an electrically conductive core member of elongated construction;

an electrically insulative member substantially about said electrically conductive core member, said electrically insulative member including at least two openings therein for exposing respective open areas of said electrically conductive core, said first exposed area adapted for connecting to a power source and said second exposed area adapted for being electrically connected to a workpiece; and an electrically insulative member adjacent said workpiece for substantially preventing a solution from contacting said core member in the region of said second area.

12. The connection of claim 11 wherein said electrically conductive core member is copper.

13. The connection of claim 11 wherein said electrically insulative member is epoxy-glass.

14. The connection of claim 11 wherein said electrically conductive core member has dendrites in said second exposed area.

15. The connection of claim 14 wherein said dendrites are palladium.

16. The connection of claim 11 wherein said electrically insulative member positioned adjacent said workpiece is an elastomer.

* * * * *